US010060955B2

(12) United States Patent
Grenat et al.

(10) Patent No.: US 10,060,955 B2
(45) Date of Patent: Aug. 28, 2018

(54) CALIBRATING POWER SUPPLY VOLTAGES USING REFERENCE MEASUREMENTS FROM CODE LOOP EXECUTIONS

(71) Applicant: Advanced Micro Devices, Inc., Sunnyvale, CA (US)

(72) Inventors: Aaron J. Grenat, Austin, TX (US); Robert A. Hershberger, Driftwood, TX (US); Sriram Sambamurthy, Austin, TX (US); Samuel D. Naffziger, Fort Collins, CO (US); Christopher E. Tressler, Driftwood, TX (US); Sho-Chien Kang, Austin, TX (US); Joseph P. Shannon, Austin, TX (US); Krishna Sai Bernucho, Austin, TX (US); Ashwin Chincholi, Austin, TX (US); Michael J. Austin, Autsin, TX (US); Steven F. Liepe, Fort Collins, CO (US); Umair B. Cheema, Richmond Hill (CA)

(73) Assignee: Advanced Micro Devices, Inc., Santa Clara, CA (US)

( * ) Notice: Subject to any disclaimer, the term of this patent is extended or adjusted under 35 U.S.C. 154(b) by 704 days.

(21) Appl. No.: 14/314,790

(22) Filed: Jun. 25, 2014

(65) Prior Publication Data

US 2015/0378411 A1 Dec. 31, 2015

(51) Int. Cl.
| | |
|---|---|
| *G06F 1/26* | (2006.01) |
| *G01R 19/00* | (2006.01) |
| *G06F 1/32* | (2006.01) |
| *G11C 29/02* | (2006.01) |
| *G11C 29/56* | (2006.01) |

(Continued)

(52) U.S. Cl.
CPC .......... *G01R 19/0084* (2013.01); *G06F 1/26* (2013.01); *G06F 1/32* (2013.01); *G11C 29/021* (2013.01); *G11C 29/028* (2013.01); *G11C 29/56012* (2013.01); *G01R 19/16552* (2013.01);

(Continued)

(58) Field of Classification Search
None
See application file for complete search history.

(56) References Cited

U.S. PATENT DOCUMENTS

| | | |
|---|---|---|
| 7,772,811 B1 | 8/2010 | Jain et al. |
| 8,519,781 B1 | 8/2013 | Zhu et al. |

(Continued)

OTHER PUBLICATIONS

International Search Report and Written Opinion correlating to PCT/US2015/037158 dated Sep. 10, 2015, 9 pages.

(Continued)

*Primary Examiner* — Kim Ngoc Huynh
*Assistant Examiner* — Danny Chan

(57) ABSTRACT

A processing system includes one or more power supply monitors (PSMs) to measure one or more first voltages corresponding to one or more locations in the processing system. The measurements are performed concurrently with the processing system executing one or more code loops. The processing system also includes calibration logic to modify a second voltage provided to the processing system based on a comparison of a reference voltage and the one or more first voltages. The reference voltage is determined based on previous execution of the one or more code loops by the processing system.

18 Claims, 9 Drawing Sheets

(51) Int. Cl.
  *G06F 11/34* (2006.01)
  *G01R 31/40* (2014.01)
  *G01R 35/00* (2006.01)
  *G01R 19/165* (2006.01)
(52) U.S. Cl.
  CPC ............ *G01R 31/40* (2013.01); *G01R 35/005* (2013.01); *G06F 11/3428* (2013.01)

(56) References Cited

U.S. PATENT DOCUMENTS

| | | | |
|---|---|---|---|
| 2005/0218871 A1 | 10/2005 | Kang et al. | |
| 2007/0271473 A1* | 11/2007 | Hosomi | G06F 1/3203 713/300 |
| 2008/0284388 A1 | 11/2008 | Oettinger et al. | |
| 2011/0074398 A1* | 3/2011 | Barton | G01R 19/0084 324/133 |
| 2011/0173432 A1* | 7/2011 | Cher | G06F 17/5045 713/100 |
| 2012/0126847 A1 | 5/2012 | Kosonocky et al. | |
| 2012/0218034 A1 | 8/2012 | Turullols et al. | |
| 2013/0147271 A1 | 6/2013 | Yotsuji et al. | |
| 2014/0253101 A1* | 9/2014 | Luo | G01R 31/40 324/130 |
| 2014/0281696 A1* | 9/2014 | Bacha | G06F 1/26 714/10 |
| 2014/0298094 A1* | 10/2014 | Aliberti | G06F 1/28 714/30 |
| 2015/0137598 A1* | 5/2015 | Hawawini | G01R 31/00 307/31 |
| 2016/0252949 A1* | 9/2016 | Virolainen | G06F 11/3062 713/323 |

OTHER PUBLICATIONS

International Preliminary Report on Patentability correlating to PCT/US15/037158 dated Dec. 27, 2016, 7 pages.
Supplementary European Search Report dated Sep. 28, 2017 for EP Application No. 15811884.4, 8 pages.

* cited by examiner

US 10,060,955 B2

CALIBRATING POWER SUPPLY VOLTAGES USING REFERENCE MEASUREMENTS FROM CODE LOOP EXECUTIONS

BACKGROUND

Field of the Disclosure

The present disclosure relates generally to processing systems and, more particularly, to supplying power to processing systems.

Description of the Related Art

Automatic test equipment (ATE) is used to test processing systems such as a system-on-a-chip (SOC) after fabrication and prior to installation in a product. For example, automated testing may be used to determine the operating frequencies of components of the SOC under different operating loads for a given applied voltage. A typical ATE includes a very high-quality voltage supply that can maintain a constant applied voltage within a very narrow tolerance for a wide range of operating loads. However, the system-level voltage supplies that are used in products such as desktop computers, laptop computers, tablets, smart phones, and the like are not able to maintain the same voltage tolerances over the same range of operating loads. For example, if the load on an SOC suddenly increases from a very low level to a relatively high level, the current drawn by the components of the SOC increases and the voltage provided to components of the SOC falls, a phenomenon known as "voltage droop." The operating frequencies of the components of the SOC also fall when the voltage droops.

The amount of voltage droop depends on the characteristics of the power supply and the load on the SOC. Virtually every product that is shipped to a consumer has a slightly different power supply and will experience different operating loads over its lifetime. Thus, the power supply characteristics and the operating loads of each consumer product are not precisely known and may change over the lifetime of the product. Consequently, an SOC that is rated for a particular operating frequency must include a voltage margin to ensure that the actual operating frequency of the SOC does not fall below the rated value during voltage droop. The voltage margin is typically set by assuming a worst-case scenario, e.g., the largest expected voltage droop under the highest operating loads. During normal operation, e.g., under moderate or light operating loads, the voltage margin is unnecessary and may therefore represent wasted power or an operating frequency in excess of the rated value.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

The voltage margins used to account for possible voltage droop in a processing system can be reduced by calibrating the voltage provided to the processing system at boot time based on a comparison of a previously determined reference voltage and measurements of voltages at different locations in the processing system. The reference voltage is determined based on a testing algorithm and the boot time voltage measurements are performed while executing the same testing algorithm. In some embodiments, the processing system is connected to a first power supply in automated test equipment (ATE) and executes a series of code loops that are defined by the testing algorithm. The reference voltage is then determined based on measurements taken by power supply monitors (PSMs) implemented in the processing system. Subsequently, the processing system executes the same series of code loops while connected to a second power supply, such as a power supply in a system-level test (SLT) environment or a power supply in a user product. Voltages are measured by the PSMs concurrently with executing the code loops. The measured voltages are then compared to the reference voltage to determine a voltage offset that should be applied to the power supply implemented in the processing system. For example, the voltage offset may be used to increase the voltage provided by the power supply if an average value of the voltages measured by the PSMs during execution of the code loops is below the reference voltage. For another example, the voltage offset may be used to decrease the voltage provided by the power supply if the average value of the voltages measured by the PSMs during execution of the code loops is higher than the reference voltage. The SOC may therefore dynamically control its power supply to keep the power supply operating at a voltage that ensures that the voltage received at locations within the SOC are near a target voltage.

Figure 1:
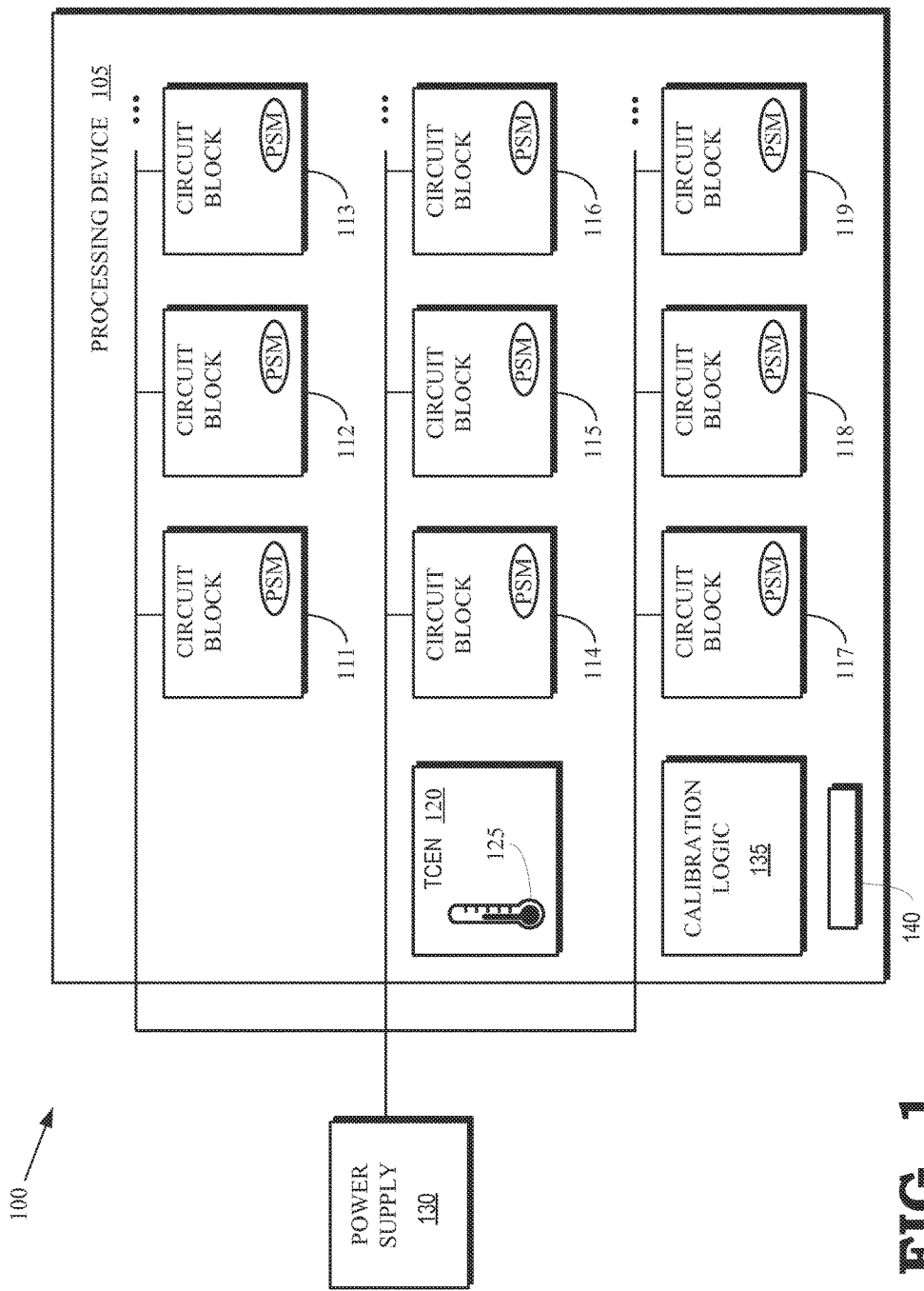
FIG. 1 is a block diagram of a processing system that includes a processing device according to some embodiments.

FIG. 1 is a block diagram of a processing system 100 that includes a processing device 105 according to some embodiments. The processing device 105 may be a data processor, a very large scale integrated circuit (VLSI), a system on a chip (SoC), a central processing unit (CPU), an accelerated processing unit (APU), a graphics processing unit (GPU), a memory sub-system, a system controller, a peripheral function, or some other type of processing device. The processing device 105 shown in FIG. 1 includes a plurality of circuit blocks 111, 112, 113, 114, 115, 116, 117, 118, 119, (referred to herein as "the circuit blocks 111-119"), which may be used to implement portions of the functionality of the processing device 105. The circuit blocks 111-119 may therefore be interconnected and communicate with each other, e.g., by transmitting or receiving signals over various lines, traces, buses, vias, through-silicon vias, and the like. In the interest of clarity, interconnections between the circuit blocks 111-119 are not shown in FIG. 1.

Each circuit block 111-119 is also associated with a power supply monitor (PSM). Exemplary PSMs are described in U.S. Patent Application Publication No. 2012/0126847, entitled Power Supply Monitor, by Stephen V. Kosonocky and Gregory K. Chen, which is incorporated herein by reference in its entirety. The PSMs may be incorporated in the circuit blocks 111-119 as shown in FIG. 1 or they may be implemented as separate devices that are coupled to the circuit blocks 111-119. However, persons of ordinary skill in the art having benefit of the present disclosure should appreciate that some embodiments of the processing device 105 may include circuit blocks 111-119 that are associated with more than one PSM. Moreover, some PSMs may be associated with more than one circuit block 111-119.

Figure 2:
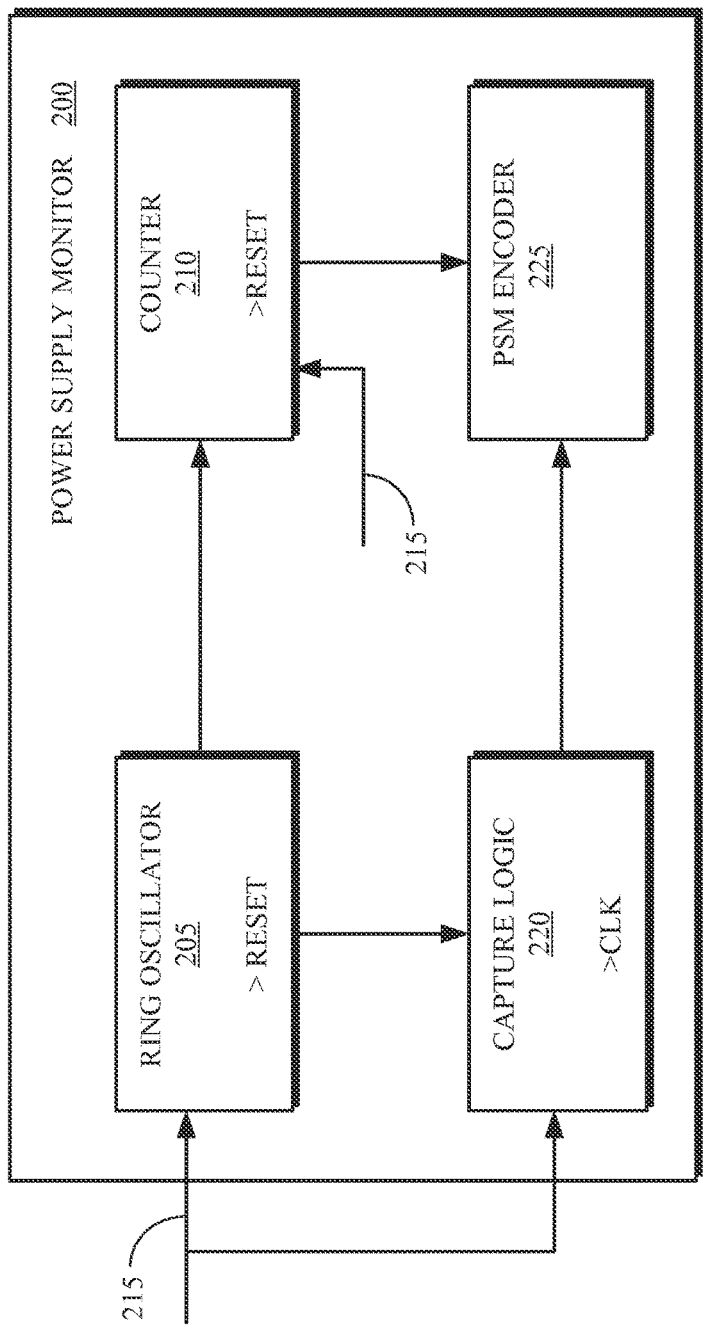
FIG. 2 is a block diagram of a power supply monitor (PSM) that may be used in the processing device shown in FIG. 1 according to some embodiments.

FIG. 2 is a block diagram of a power supply monitor (PSM) 200 that may be used in the processing device 105 shown in FIG. 1 according to some embodiments. Some embodiments of the power supply monitor 200 include a ring oscillator 205 that may be formed of multiple stages and the number of stages used to form the ring oscillator 205 may determine, at least in part, the voltage resolution of the power supply monitor 200. Techniques for implementing and operating ring oscillators 205 are known in the art and in the interest of clarity only those aspects of implementing or operating the ring oscillator 205 that are relevant to the claimed subject matter are discussed herein.

A counter 210 in the power supply monitor 200 can count the number of stage transitions in the ring oscillator 205 during a selected measurement period such as a clock cycle, a combination of multiple clock cycles, or a fraction of a clock cycle. For example, voltage droops can slow the oscillator speed of the ring oscillator 205, resulting in fewer stage transitions in the multiple stages of the ring oscillator 205. Increases in the voltage may increase the oscillator speed of the ring oscillator 205 and therefore increase the number of stages traversed in a clock cycle. The multiple stages of the ring oscillator 205 are arranged in a ring and so the counter 210 may also count a number of revolutions of the ring oscillator 205 during the measurement period. The number of revolutions increases when the voltage increases and decreases during voltage droops. Some embodiments of the ring oscillator 205 or the counter 210 may be reset on a leading edge of a clock cycle provided by the clock signal 215. Capture logic 220 can capture the state of the ring oscillator at the end of the measurement period.

The number of stage transitions or ring oscillator revolutions may be indicative of the voltage at the power supply monitor 200. Information indicating the number of stage transitions or ring oscillator revolutions counted by the counter 210 (and consequently the voltage measured by the counter 210) during the selected measurement period can be provided to a PSM encoder 225 that supplies a PSM output signal based on the state of the ring oscillator 205 and the number of ring oscillator revolutions at the end of the measurement period. Some embodiments of the power supply monitor 200 may provide this information using an interface (not shown). For example, the power supply monitor 200 may provide a signal indicating a number of stage transitions of the ring oscillator 205, which is indicative of the voltage measured by the power supply monitor 200, via an interface such as a scan chain that operates according to JTAG protocols. The interface may receive capture clock pulses 235 such as the capture clock pulses provided by a scan tester (not shown).

Referring back to FIG. 1, the relation between the count values returned by the PSM and the PSM voltages may be a function of temperature. Leakage currents for the circuit blocks 111-119 may also depend on temperature. Some embodiments of the processing system may therefore include temperature sensor logic (TCEN) 120 that can be used to determine temperatures on the processing device 105. For example, the TCEN 120 may include or be coupled to a temperature sensor 125 for monitoring temperatures. The temperature sensor 125 may be a single sensor or may be representative of a plurality of sensors distributed throughout the processing device 105.

The processing system 100 also includes a power supply 130 that can be coupled to the processing device 105 to provide power to the circuit blocks 111-119 at a nominal voltage. The processing device 105 may be coupled to different power supplies 130 during different stages. For example, the power supply 130 may be an ATE power supply 130 during ATE testing of the processing device 105, an SLT power supply 130 during system-level testing of the processing device 105, and a consumer device power supply 130 after the processing device 105 has been installed in a consumer product. The characteristics of the different power supplies 130 may be significantly different. For example, an ATE power supply 130 is typically a very high-quality power supply 130 that may experience substantially no voltage droop (or a voltage droop that is within a very low tolerance such as a few mV for a 1.3V applied voltage) during testing of the processing device 105. For another example, an SLT power supply 130 or a consumer product power supply 130 may experience significantly higher voltage droops, e.g., a voltage droop of 0.05V to 0.1V for a 1.3V applied voltage under high operating loads that may occur during testing of the processing device 105. The characteristics of different consumer product power supplies 130 may differ from each other and may change over time as the power supply 130 ages.

The processing device 105 may therefore include calibration logic 135 that can determine voltages supplied to the circuit blocks 111-119 and use these voltages to generate a calibration signal for controlling the voltage provided by the power supply 130. For example, as discussed herein, the voltages in the circuit blocks 111-119 may not be equal to the voltage generated by the power supply 130, e.g. due to voltage droop. Each PSM may therefore measure voltages at the location of the PSM and the measured voltages may be indicative of the voltage that is applied to the corresponding circuit block 111-119. The calibration logic 135 may access the measured voltages from the PSMs and compare the measured voltages to a reference voltage, which may be stored in a storage element 140 that may be formed of registers or fuses. For example, the calibration logic 135 may compare an average of the voltages measured by the PSMs or a minimum voltage from among the voltages measured by the PSMs to the reference voltage and then provide an adjustment signal to the power supply 130, as discussed herein.

The reference voltage may be determined during testing of the processing device 105. In some embodiments, the processing device 105 is tested by executing a series of code loops that are defined by a testing algorithm, which may be implemented by the calibration logic 135. The code loops may be executed while the processing device 105 is coupled to an ATE power supply 130. The calibration logic 135 reads values from the PSMs concurrently with executing the code loops and then determines the reference voltage based on the measured values of the PSM voltages. Some embodiments of the calibration logic 135 may use statistical combinations of the PSM voltages such as means of the PSM voltages, a median of the PSM voltages, a mode of the PSM voltages, a minimum of the PSM voltages, a maximum of the PSM voltages, and the like. Subsequently, the processing device 105 may be coupled to other power supplies 130 and the same testing algorithm may be executed to calibrate the other power supplies 130 by comparison to the reference voltage, as discussed herein.

Figure 3:
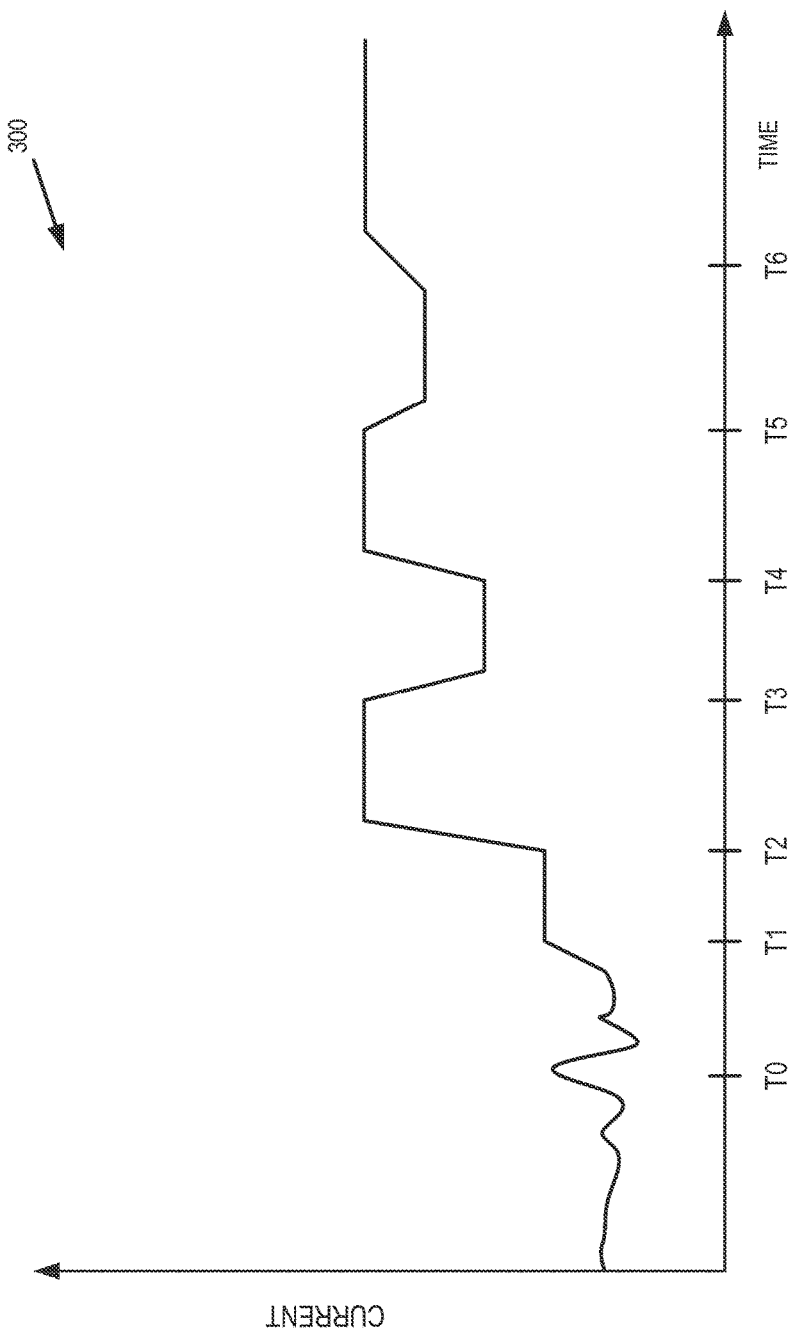
FIG. 3 is a plot of current drawn from a power supply as a function of time during execution of code loops defined by testing algorithm according to some embodiments.

FIG. 3 is a plot 300 of current drawn from a power supply as a function of time during execution of code loops defined by a testing algorithm according to some embodiments. The vertical axis indicates the current (in arbitrary units) and the horizontal axis indicates the time (in arbitrary units) increasing from left to right. Some embodiments of the plot 300 may correspond to current drawn by the processing device 105 while executing code loops defined by a testing algorithm implemented in the calibration logic 135 shown in FIG. 1. The same testing algorithm may be executed by the calibration logic 135 each time the processing device 105 boots up. Some embodiments of the testing algorithm illustrated in the plot 300 may be designed to test AC response, DC response, or resonant frequencies of processing device 105.

At T<T0, the processing device is in a quiescent or inactive state and the current corresponds to leakage currents in the processing device.

At T=T0, a system BIOS initiates a system management unit (SMU) routine to begin testing of the processing device.

At T1<T<T2, the processing device executes a first base power code loop. The voltage at locations in the processing device may settle or stabilize over this time interval. Voltage measurements may therefore be performed by PSMs during this time interval and concurrently with execution of the first base power code loop.

At T=T2, a step load is applied to the processing device to increase the supply of power to a maximum level that can be provided by the power supply. The current therefore rises to a maximum value and stays at this level until T=T3. Voltage measurements may be performed by PSMs during this time interval concurrently with execution of the code that creates the step load.

At T3<T<T4, the processing device executes a second base power code loop. The operating load corresponding to the second base power code loop is larger than the operating load corresponding to the first base power code loop, as indicated by the higher values of the current. The voltage at locations in the processing device may settle or stabilize over this time interval. Voltage measurements may be performed by PSMs concurrently with execution of the second base power code loop.

At T=T4, a step load is applied to the processing device to increase the supply of power to the maximum level that can be provided by the power supply. The current therefore rises to a maximum value and stays at this level until T=T5. Voltage measurements may be performed by PSMs concurrently with execution of the code used to generate the step load.

At T5<T<T6, the processing device executes a third base power code loop. The operating load corresponding to the third base power code loop is larger than the operating load corresponding to the second base power code loop, as indicated by the higher values of the current. The voltage at locations in the processing device may settle or stabilize over this time interval. Voltage measurements may be performed by PSMs concurrently with execution of the third base power code loop.

At T=T6, a step load is applied to the processing device to increase the supply of power to the maximum level that can be provided by the power supply. The current therefore rises to a maximum value and stays at this level until the testing algorithm completes. Final voltage measurements may be performed by PSMs after a time interval sufficient to allow the voltages to stabilize and concurrently with execution of the code that generates the step load.

Figure 4:
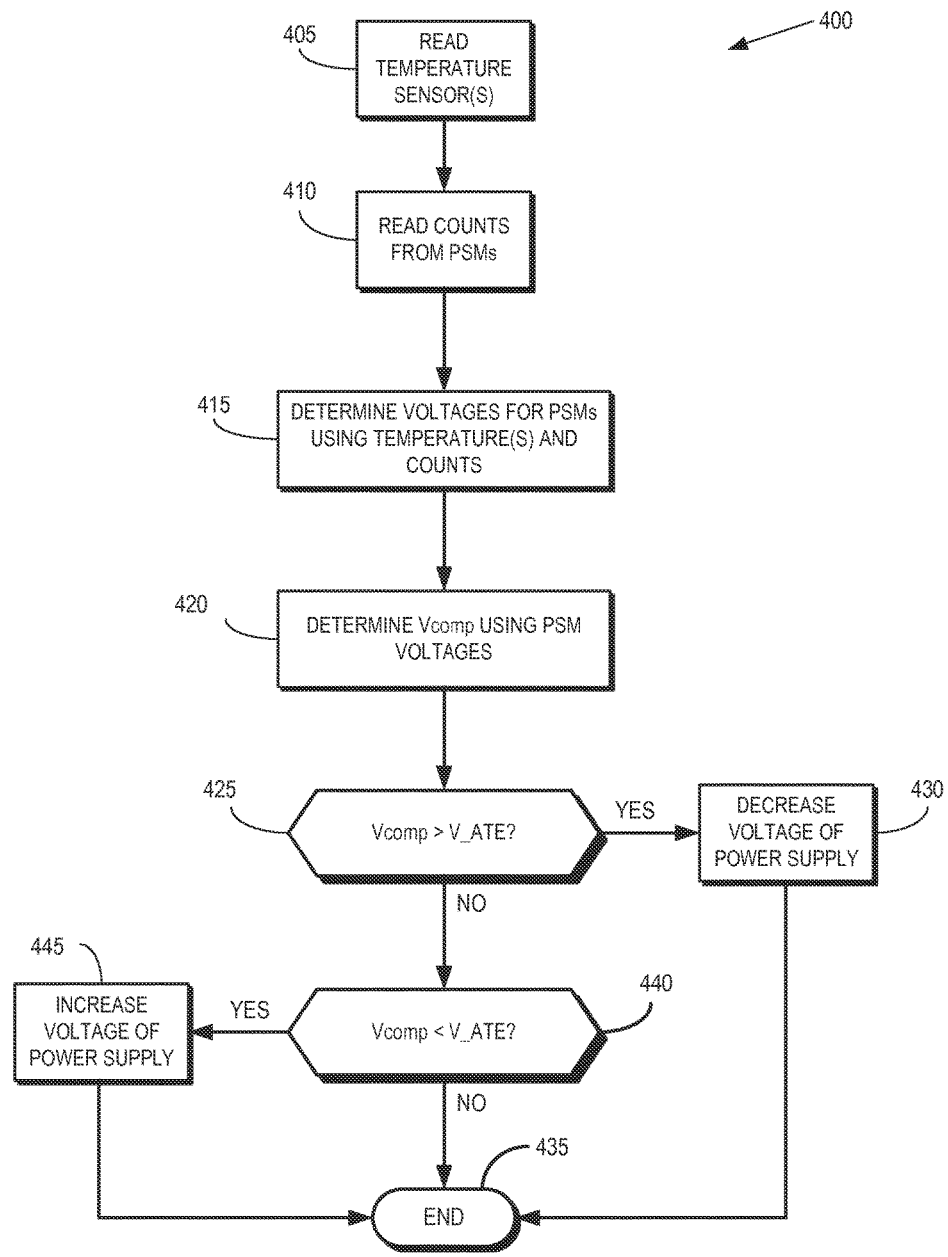
FIG. 4 is a flow diagram of a method for calibrating a power supply that provides power to a processing device according to some embodiments.

FIG. 4 is a flow diagram of a method 400 for calibrating a power supply that provides power to a processing device according to some embodiments. The method 400 may be implemented in calibration logic such as the calibration logic 135 shown in FIG. 1 and may be initiated in response to boot up of a processing device such as the processing device 105 shown in FIG. 1. At block 405, the calibration logic reads temperatures provided by one or more temperature sensors or temperature sensing logic such as the TCEN 120 shown in FIG. 1. Some embodiments of the calibration logic read the temperatures as an initial step so that the temperature can be determined before it decreases due to inactivity.

At block 410, the calibration logic reads counts from the PSMs in the processing device. Some embodiments of the PSMs may be sensitive to temperature. The counts may therefore be converted (at block 415) to voltages based on the temperature that was read by the calibration logic at block 405. For example, the temperature value may be compared to a reference temperature and the difference may be used to scale the measured counts from the PSMs, e.g., by increasing or decreasing the measured counts in proportion to the difference between the measured temperature value and the reference temperature. The scaled counts may then be used to determine the voltage at the PSM. The tests performed at block 405, 410, 415 may be iterated to measure voltages at different stages in the testing algorithm, e.g., as illustrated in FIG. 3.

At block 420, the calibration logic determines a comparison voltage (Vcomp) based on the voltages measured by the PSMs. Some embodiments of the calibration logic may determine the comparison voltage using a minimum-of-minimums of the voltages measured by the PSMs during execution of the testing algorithm. However, the calibration logic may also determine the comparison voltage using other statistical combinations of the measured voltages such as means, medians, modes, maximums, and the like.

At decision block 425, the calibration logic compares the comparison voltage to a reference voltage such as a voltage (V_ATE) determined during ATE testing. As discussed herein, the reference voltage and the comparison voltage are determined using the same testing algorithm and the same statistical combination of the measured voltages. If the comparison voltage is larger than the reference voltage, then the calibration logic may generate (at block 430) a signal instructing the power supply to decrease its supply voltage. The method 400 may then end at block 435. If the comparison voltage is smaller than the reference voltage (as determined at decision block 440), the calibration logic may generate (at block 445) a signal instructing the power supply to increase its supply voltage. The method 400 may then end at block 435.

Figure 5:
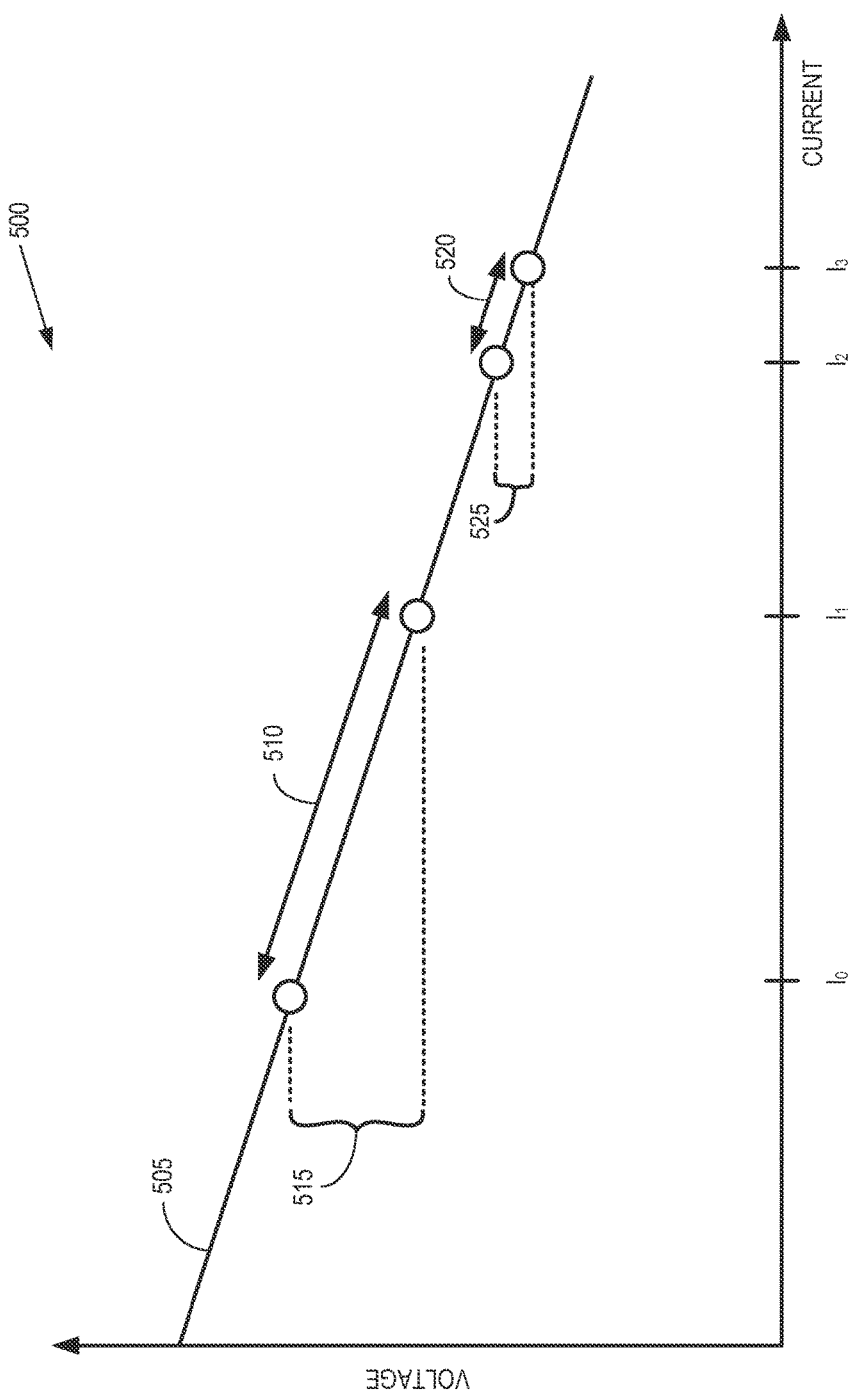
FIG. 5 is a plot of a load line that may be used to adjust the voltage provided by a power supply to compensate for leakage current according to some embodiments.

FIG. 5 is a plot 500 of a load line 505 that may be used to adjust the voltage provided by a power supply to compensate for leakage current according to some embodiments.

The vertical axis is a voltage (in arbitrary units) provided by a power supply and the horizontal axis is a leakage current (in arbitrary units) at the corresponding voltage. Leakage currents typically increase with increasing temperature and FIG. 5 shows the voltage adjustments that may be used to compensate for leakage currents at different temperatures in two processing devices that have different sensitivities to temperature. For example, at low temperatures the leakage current of the first processing device may be a relatively low current ($I_0$) and may increase to a relatively high current ($I_1$) at higher temperatures. The power supply voltage may therefore be varied along the load line (as indicated by the arrow 510) to compensate for the variations in the leakage current. The power supply voltage may vary within the range 515 for the first processing device. For another example, at low temperatures the leakage current of the second processing device may be a relatively low current ($I_2$) and may increase to a relatively high current ($I_3$) at higher temperatures, although the variation in leakage currents is smaller than for the first processing device. The power supply voltage may therefore be varied along the load line (as indicated by the arrow 520) to compensate for the variations in the leakage current. The power supply voltage may therefore vary within the range 525 for the second processing device.

The calibration logic used for boot time calibration (such as the calibration logic 135 shown in FIG. 1) should account for variations in the voltage provided by the power supply that are generated by the load line or other voltage compensation mechanisms. For example, if logic associated with the load line instructs the power supply to increase or decrease its voltage to compensate for leakage currents, the calibration logic should account for this modification so that the actual voltage provided by the power supply after incorporating modifications from the load line logic and the calibration logic corresponds to the reference voltage, at least within a predetermined tolerance. For example, the calibration logic may add or subtract a load line voltage adjustment from the comparison voltage determined at boot time to avoid an over-voltage condition.

Figure 6:
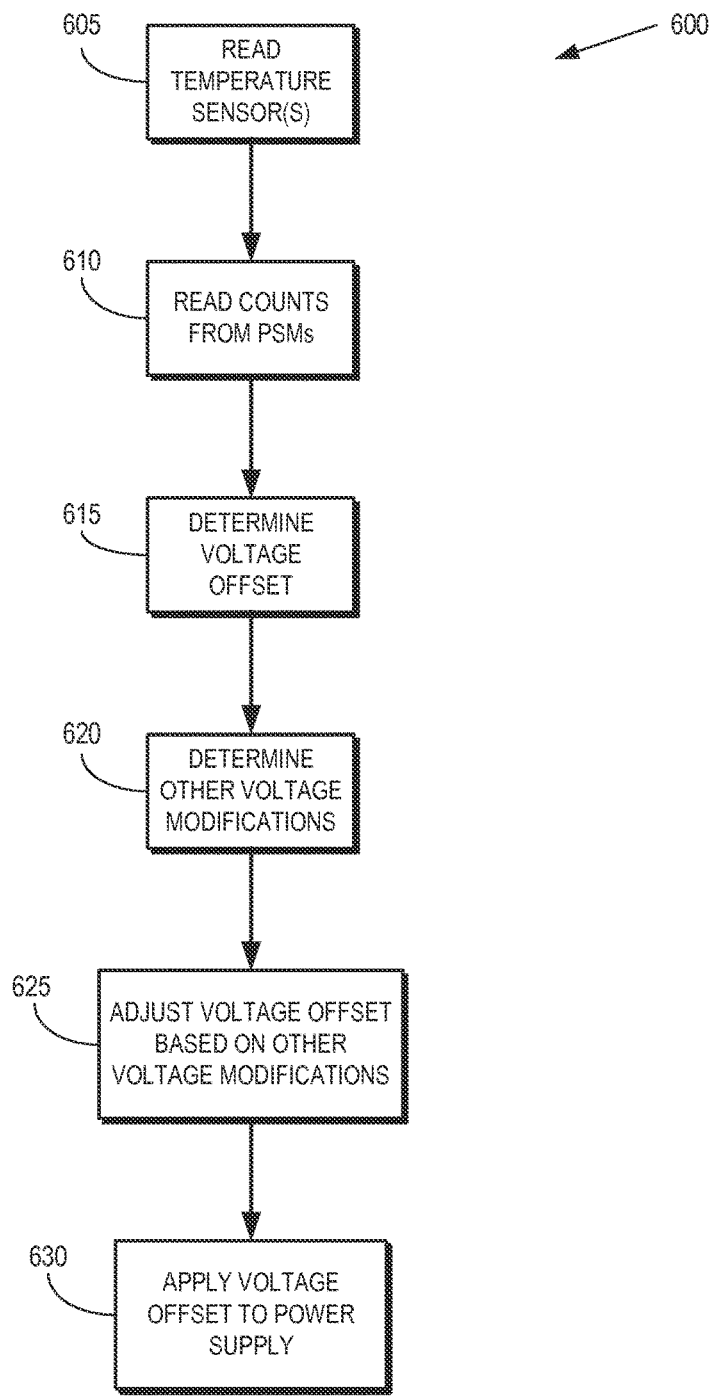
FIG. 6 is a flow diagram of a method for calibrating a power supply to account for other voltage modifications according to some embodiments.

FIG. 6 is a flow diagram of a method 600 for calibrating a power supply to account for other voltage modifications according to some embodiments. The method 600 may be implemented in calibration logic such as the calibration logic 135 shown in FIG. 1 and may be initiated in response to boot up of a processing device such as the processing device 105 shown in FIG. 1. At block 605, the calibration logic reads temperatures provided by one or more temperature sensors or temperature sensing logic such as the TCEN 120 shown in FIG. 1. At block 610, the calibration logic reads counts from the PSMs in the processing device. As discussed herein, blocks 605 or 610 may be iterated to gather voltage measurements concurrently with execution of multiple code loops according to a testing algorithm. At block 615, the calibration logic determines a voltage offset. For example, the voltage offset may be set equal to the difference between the previously determined reference voltage and a comparison voltage determined based on the measured voltages.

At block 620, the calibration logic may determine other voltage modifications. For example, the calibration logic may access information indicating voltage compensations determined using a load line such as the load line 505 shown in FIG. 5. The voltage compensation determined by the load line may depend on the temperature of the processing device and the calibration logic may therefore use the temperatures provided by temperature sensing logic to determine the voltage compensation. Some embodiments may apply other voltage compensations. For example, a fixed voltage offset may be applied to account for an expected difference between the voltages provided by a first power supply (such as an ATE power supply) and a second power supply (such as an SLT or consumer product power supply). At block 625, the calibration logic may adjust the voltage offset based on the other voltage compensations. For example, the calibration logic may adjust the voltage offset so that the net change to the voltage provided by the power supply is equal to a difference between the reference voltage and the comparison voltage determined based on the PSM measurements. At block 630, the voltage offset may be applied to the power supply to modify the voltage provided by the power supply.

Figure 7:
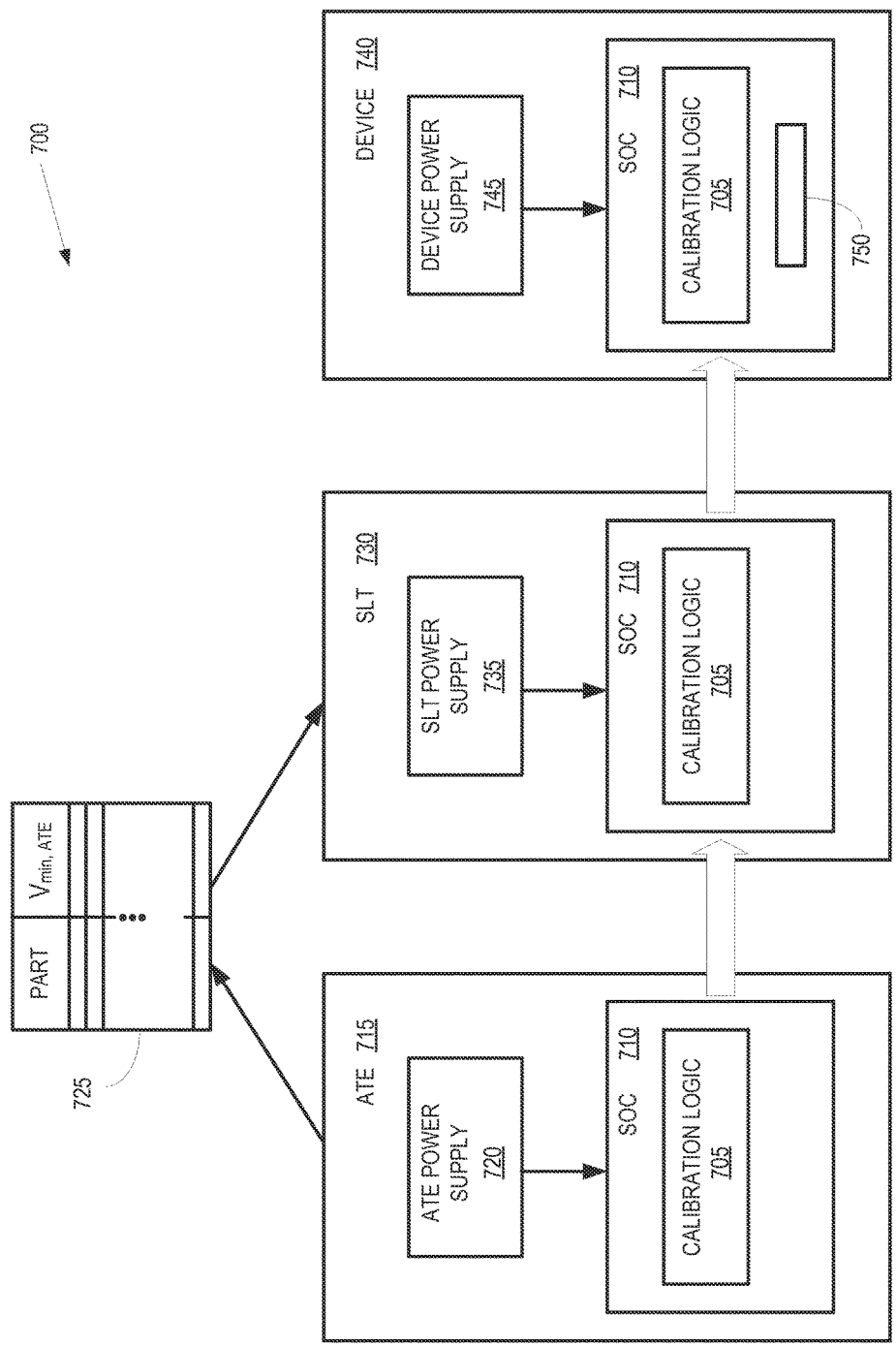
FIG. 7 is a block diagram illustrating operation of calibration logic in an SOC in different operational contexts according to some embodiments.

FIG. 7 is a block diagram 700 illustrating operation of calibration logic 705 in an SOC 710 in different operational contexts according to some embodiments. Some embodiments of the calibration logic 705 may correspond to the calibration logic 135 in the processing device 105 shown in FIG. 1. The SOC 710 is initially placed into an ATE 715 for testing. The SOC 710 is coupled to an ATE power supply 720 and then the calibration logic 705 may initiate a test algorithm that causes the SOC 710 to execute one or more code loops that place different operating loads on the SOC 710. As discussed herein, the calibration logic 705 may determine a reference voltage using one or more PSM voltage measurements performed concurrently with execution of the code loops. The reference voltage may then be associated with the SOC 710 and stored. Some embodiments may store the reference voltage in a database 725 that lists the reference voltage is for each part that is tested in the ATE 715. The database 725 may be accessed by other testing devices or other software, firmware, or hardware for other purposes.

The SOC 710 may subsequently be moved to an SLT environment 730 for system-level testing. The SOC 710 is coupled to an SLT power supply 735 and then the calibration logic 705 may initiate the test algorithm that causes the SOC 710 to execute one or more code loops that place different operating loads on the SOC 710. The test algorithm used by the SOC 710 in the SLT 730 is the same as the test algorithm used by the SOC 710 in the ATE 715. As discussed herein, the calibration logic 705 may determine a comparison voltage using one or more PSM voltage measurements performed concurrently with execution of the code loops. The calibration logic 705 may then compare the comparison voltage to the reference voltage, e.g., the reference voltage stored in the database 725. Based on the comparison, the calibration logic 705 may then provide a calibration signal to the SLT power supply 735 to adjust the voltage provided to the SOC 710 by the SLT power supply 735, as discussed herein. The adjusted voltage may then be provided to the SOC 710 during subsequent performance testing.

The SOC 710 may subsequently be installed in a consumer product or device 740. The installed SOC 710 is coupled to a device power supply 745. The reference voltage is stored in a storage element 750 such as a set of registers or fuses that can be configured using the information stored in the database 725. The calibration logic 705 may then initiate the test algorithm each time the device 740 is booted up so that the SOC 710 executes the code loops defined by the testing algorithm at boot time. The test algorithm used by the SOC 710 in the device 740 is the same as the test algorithm used by the SOC 710 in the ATE 715 and the SLT 730. As discussed herein, the calibration logic 705 may determine a comparison voltage using one or more PSM voltage measurements performed concurrently with execution of the code loops. The calibration logic 705 may then compare the comparison voltage to the reference voltage, e.g., the reference voltage stored in the storage element 750. Based on the comparison, the calibration logic 705 may provide a calibration signal to the device power supply 745 to adjust the voltage provided to the SOC 710 by the device power supply 745, as discussed herein. The adjusted voltage may then be provided to the SOC 710 during normal operation of the device 740.

Figure 8:
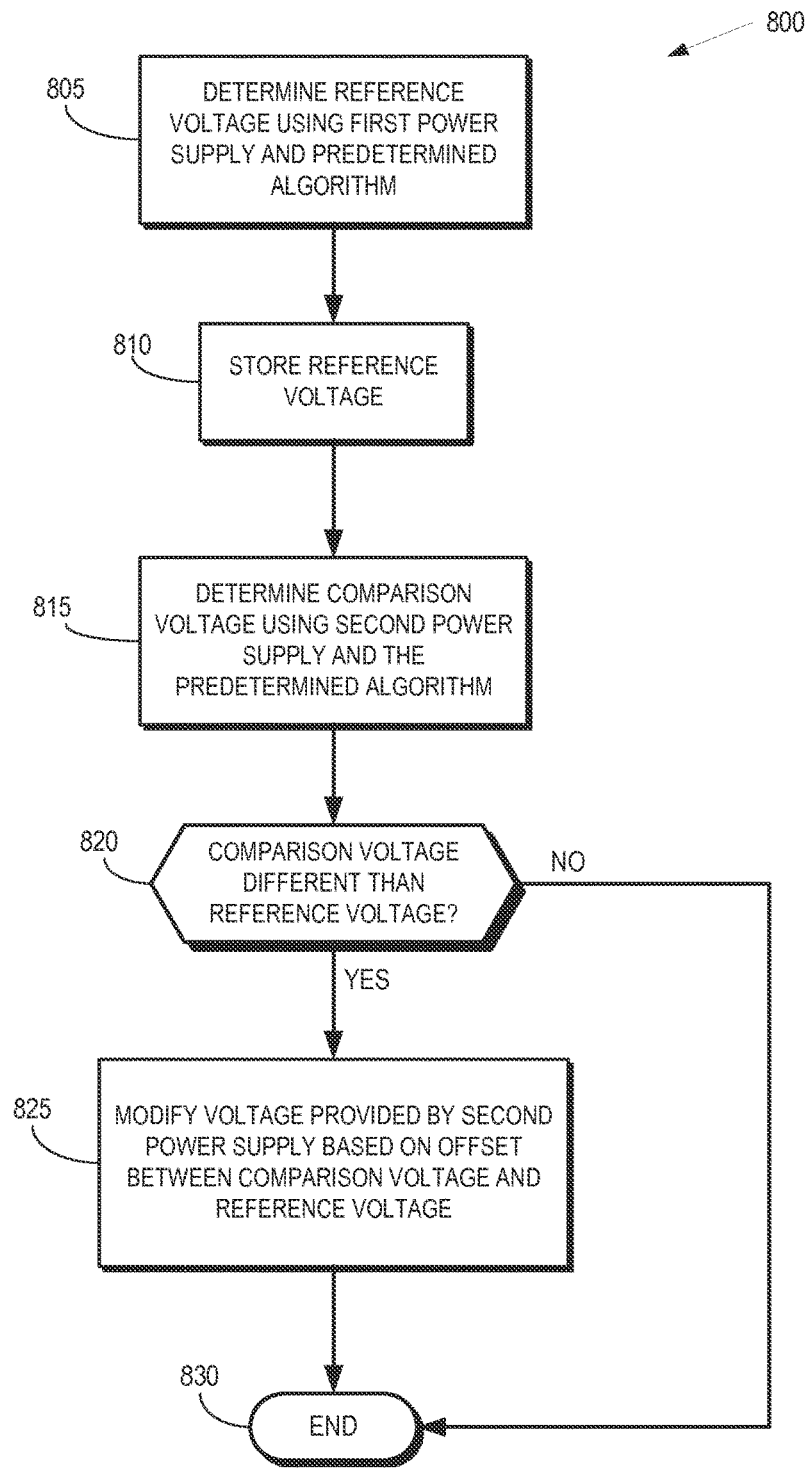
FIG. 8 is a flow diagram of a method for creating a reference voltage using a first power supply and then modifying a voltage provided by a second power supply based on the reference voltage according to some embodiments.

FIG. 8 is a flow diagram of a method 800 for creating a reference voltage using a first power supply and then modifying a voltage provided by a second power supply based on the reference voltage according to some embodiments. The method 800 may be implemented in calibration logic of a processing device such as the calibration logic 135 of the processing device 105 shown in FIG. 1. At block 805, the calibration logic determines a reference voltage while the processing device is coupled to a first power supply. The reference voltage is determined using voltage measurements performed concurrently with executing a predetermined testing algorithm, as discussed herein. At block 810, the reference voltage is stored, e.g., in a database, a set of registers, or a set of fuses. The processing device may then be disconnected from the first power supply and connected to a second power supply.

At block 815, the calibration logic determines a comparison voltage using voltage measurements performed concurrently with executing the predetermined testing algorithm, as discussed herein. At decision block 820, the calibration logic determines whether the comparison voltage is different than the reference voltage. If so, the calibration logic modifies (at block 825) the voltage provided by the second power supply based on an offset between the comparison voltage and the reference voltage, as discussed herein. The method may then end at block 830. If the comparison voltage is not different than the reference voltage, e.g., the difference between the comparison voltage and the reference voltage is less than a predetermined tolerance, the calibration logic bypasses modifying the voltage provided by the second power supply and the method may end at block 830.

In some embodiments, the apparatus and techniques described above are implemented in a system comprising one or more integrated circuit (IC) devices (also referred to as integrated circuit packages or microchips), such as the processing device described above with reference to FIGS. 1-8. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 9:
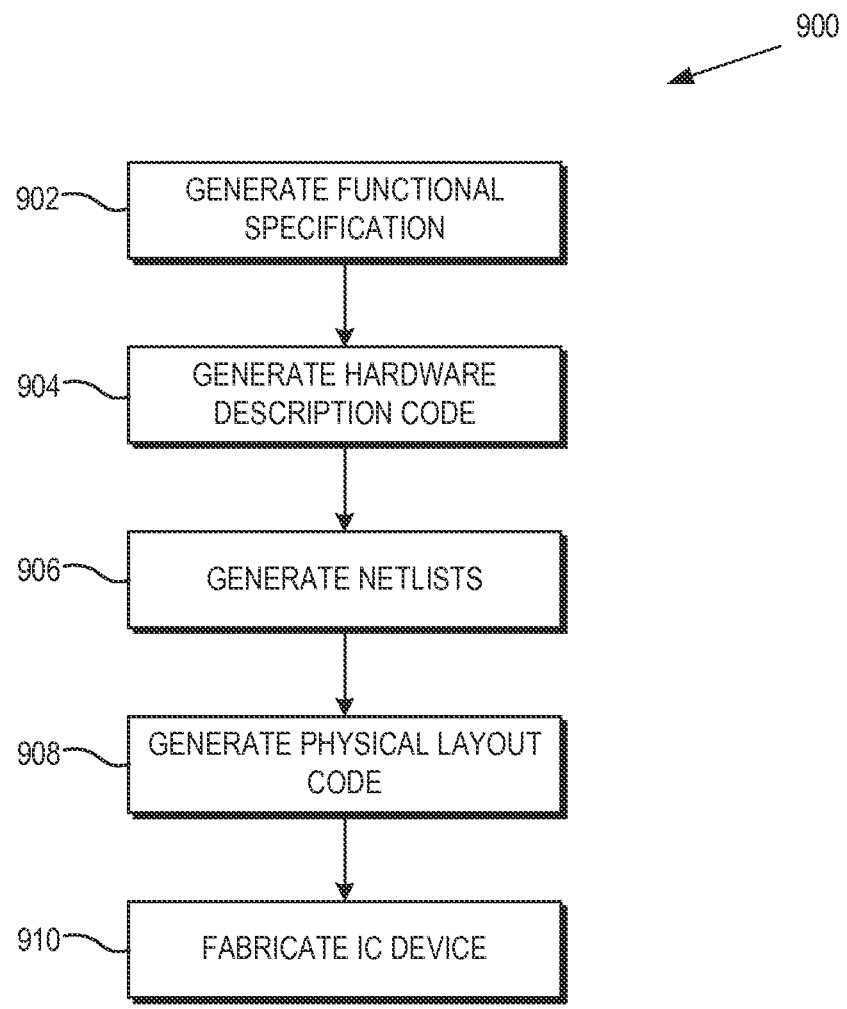
FIG. 9 is a flow diagram illustrating a method for designing and fabricating an integrated circuit device implementing at least a portion of a component of a processing system in accordance with some embodiments.

FIG. 9 is a flow diagram illustrating an example method 900 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 902 a functional specification for the IC device is generated. The functional specification (often referred to as a micro architecture specification (MAS)) may be represented by any of a variety of programming languages or modeling languages, including C, C++, SystemC, Simulink, or MATLAB.

At block 904, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 906 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 908, one or more EDA tools use the netlists produced at block 906 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 910, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An apparatus comprising:
at least one power supply monitor (PSM) to measure voltages at a plurality of locations in a processing system concurrently with the processing system executing a plurality of code loops at each of the plurality of locations during a first execution, wherein a reference voltage is determined based on a statistical combination of voltages measured during the first execution; and
calibration logic to modify a second voltage provided to the processing system based on a comparison of the reference voltage and a comparison voltage based on the statistical combination of voltages measured by said at least one PSM concurrently with said processing system executing the plurality of code loops at each of the plurality of locations during a second execution.

2. The apparatus of claim 1, wherein the calibration logic is to generate the comparison voltage using at least one of a mean of the voltages, a median of the voltages, a mode of the voltages, a minimum of the voltages, and a maximum of the voltages.

3. The apparatus of claim 1, wherein the calibration logic is to increase the second voltage when the comparison voltage is less than the reference voltage and decrease the second voltage when the comparison voltage is greater than the reference voltage.

4. The apparatus of claim 1, wherein the calibration logic is to determine a voltage compensation to account for leakage current in the processing system, and wherein the calibration logic is to modify the second voltage based on the voltage compensation and the comparison of the reference voltage and said comparison voltage.

5. The apparatus of claim 1, wherein the calibration logic is to determine the reference voltage based on a first voltage measured by said at least one PSM concurrently with said processing system executing a first code loop and a third voltage measured by said at least one PSM concurrently with said processing system executing a second code loop, and wherein power provided to the processing system at said first and third voltages are provided by a first power supply.

6. The apparatus of claim 5, wherein power provided to the processing system at the second voltage is provided by a second power supply.

7. The apparatus of claim 6, wherein said at least one PSM is to measure said first voltage concurrently with the processing system executing said first code loop in response to the processing system booting up, and wherein the calibration logic is to modify the second voltage provided by the second power supply in response to the processing system booting up.

8. The apparatus of claim 1, further comprising:
at least one storage element for storing information indicating the reference voltage.

9. A method comprising:
measuring voltages, with at least one power supply monitor (PSM), at a plurality of locations in a processing system concurrently with the processing system executing a plurality of code loops at each of the plurality of locations during a first execution, wherein a reference voltage is determined based on a statistical combination of voltages measured during the first execution; and modifying a second voltage provided to the processing system based on a comparison of the reference voltage and a comparison voltage based on the statistical combination of voltages measured by said at least one PSM concurrently with said processing system executing the plurality of code loops at each of the plurality of locations during a second execution.

10. The method of claim 9, wherein the comparison voltage is generated using at least one of a mean of the voltages, a median of the voltages, a mode of the voltages, a minimum of the voltages, and a maximum of the voltages.

11. The method of claim 9, further comprising:
increasing the second voltage when the comparison voltage is less than the reference voltage; and
decreasing the second voltage when the comparison voltage is greater than the reference voltage.

12. The method of claim 9, further comprising:
determining a voltage compensation to account for leakage current in the processing system; and
modifying the second voltage based on the voltage compensation and the comparison of the reference voltage and said comparison voltage.

13. The method of claim 9, further comprising:
determining the reference voltage based on a first voltage measured by said at least one PSM concurrently with said processing system executing a first code loop and a third voltage measured by said at least one PSM concurrently with said processing system executing a second code loop, and wherein power provided to the processing system at said first and third voltages are provided by a first power supply.

14. The method of claim 13,
wherein power provided to the processing system at the second voltage is provided by a second power supply.

15. That method of claim 14, wherein said first voltage is measured concurrently with the processing system executing said first code loop in response to the processing system booting up, and wherein modifying the second voltage comprises modifying the second voltage provided by the second power supply in response to the processing system booting up.

16. The method of claim 9, further comprising:
storing information indicating the reference voltage.

17. A non-transitory computer readable storage medium embodying a set of executable instructions, the set of executable instructions to manipulate a processing system to:

measure voltages, with at least one power supply monitor (PSM), at a plurality of locations in the processing system concurrently with the processing system executing a plurality of code loops at each of the plurality of locations during a first execution, wherein a reference voltage is determined based on a statistical combination of voltages measured during the first execution; and modify a second voltage provided to the processing system based on a comparison of the reference voltage and a comparison voltage based on the statistical combination of voltages measured by said at least one PSM concurrently with said processing system executing the plurality of code loops at each of the plurality of locations during a second execution.

18. The non-transitory computer readable storage medium of claim 17, further embodying a set of executable instructions to manipulate the processing system to:
determine the reference voltage based on a first voltage measured concurrently with executing a first code loop and a third voltage measured concurrently with executing a second code loop, and wherein power provided to the processing system at said first and third voltages are provided by a first power supply.

* * * * *